United States Patent
Fazzio et al.

(10) Patent No.: US 7,538,477 B2
(45) Date of Patent: May 26, 2009

(54) MULTI-LAYER TRANSDUCERS WITH ANNULAR CONTACTS

(75) Inventors: R. Shane Fazzio, Loveland, CO (US); Walter Dauksher, Fort Collins, CO (US); Atul Goel, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 67 days.

(21) Appl. No.: 11/737,725

(22) Filed: Apr. 19, 2007

(65) Prior Publication Data

US 2008/0122317 A1 May 29, 2008

Related U.S. Application Data

(63) Continuation-in-part of application No. 11/604,478, filed on Nov. 27, 2006.

(51) Int. Cl.
*H01L 41/08* (2006.01)
(52) U.S. Cl. .................... 310/366; 310/334
(58) Field of Classification Search ......... 310/330–332, 310/366, 324
See application file for complete search history.

(56) References Cited

U.S. PATENT DOCUMENTS

| | | | |
|---|---|---|---|
| 2,875,355 A | 2/1959 | Petermann | |
| 2,943,278 A | 6/1960 | Mattiat | |
| 2,976,501 A * | 3/1961 | Mattiat | 333/32 |
| 3,384,767 A | 5/1968 | Arnold | |
| 4,129,799 A | 12/1978 | Green | |
| 4,529,904 A | 7/1985 | Hattersley | |
| 4,868,446 A | 9/1989 | Kumada | |
| 4,985,926 A | 1/1991 | Foster | |
| 5,663,505 A * | 9/1997 | Nakamura | 73/702 |
| 5,784,340 A | 7/1998 | Kanai | |
| 5,814,922 A | 9/1998 | Uchino et al. | |
| 6,040,654 A * | 3/2000 | Le Letty | 310/366 |
| 6,346,764 B1 | 2/2002 | Boyd | |
| 6,362,559 B1 | 3/2002 | Boyd | |
| 6,667,566 B2 * | 12/2003 | Kim et al. | 310/366 |
| 6,919,669 B2 | 7/2005 | Bryant et al. | |
| 7,224,105 B2 * | 5/2007 | Onishi et al. | 310/365 |
| 2002/0030424 A1 * | 3/2002 | Iwata | 310/363 |
| 2005/0194867 A1 | 9/2005 | Kawakubo | |
| 2008/0122317 A1 | 5/2008 | Fazzio et al. | |
| 2008/0122320 A1 | 5/2008 | Fazzio | |

FOREIGN PATENT DOCUMENTS

| | | |
|---|---|---|
| CA | 2268415 | 10/2000 |
| EP | 0451533 | 10/1991 |

OTHER PUBLICATIONS

Ried, Robert P., et al., "Piezoelectric Microphone with On-Chip CMOS Circuits", *Journal of Microelectromechanical Systems*, vol. 2, No. 3., (Sep. 1993),111-120.

Loeppert, Peter V., et al., "SiSonic—The First Commercialized MEMS Microphone", *Solid-State Sensors, Actuators, and Microsystems Workshop*, Hilton Head Island, South Carolina, (Jun. 4-8, 2006),27-30.

Niu, Meng-Nian et al., "Piezoelectric Bimorph Microphone Built on Micromachined Parylene Diaphragm", *Journal of Microelectromachanical Systems*, vol. 12, No. 6, (Dec. 2003),892-898.

* cited by examiner

*Primary Examiner*—Mark Budd

(57) ABSTRACT

Transducer structures having multiple piezoelectric layer and annular contacts are described.

22 Claims, 5 Drawing Sheets

300

318

400

MULTI-LAYER TRANSDUCERS WITH
ANNULAR CONTACTS

CROSS-REFERENCE TO RELATED APPLICATIONS

The present application is a continuation-in-part of commonly owned U.S. patent application Ser. No. 11/604,478, to R. Shane Fazzio, et al. entitled TRANSDUCERS WITH ANNULAR CONTACTS and filed on Nov. 27, 2006. Priority is claimed under 35 U.S.C. § 120 and the entire disclosure of this parent application is specifically incorporated herein by reference.

BACKGROUND

Microphones (mics) are provided in a wide variety of electronic applications. As the need to reduce the size of many components continues, the demand for reduced-size mics continues to increase as well. This has lead to comparatively small mics, which may be micromachined according to technologies such as micro-electromechanical systems (MEMS) technology.

One type of mic is a micromachined piezoelectric mic. The piezoelectric mic includes a layer of piezoelectric material between two conductive plates (electrodes). An acoustic wave incident on the membrane of the mic results in the application of a time varying force to the piezoelectric material. Application of this force to piezoelectric material results in induced stresses in the piezoelectric material, which in-turn creates a time-varying voltage signal across the material. This time-varying voltage signal may be measured by sensor circuits to determine the characteristics of the incident acoustic wave. Alternatively, this time-varying voltage signal may produce a time-varying charge that is provided to sensor circuits that process the signal and determine the characteristics of the incident acoustic wave.

The capacitance of a piezoelectric mic may be represented:

$$C = \frac{A_\kappa \varepsilon_0}{d}, \quad \text{(Eqn. 1)}$$

where A is the common area of the (plate) electrodes of the mic, $\kappa$ is the dielectric constant of the piezoelectric material, $\varepsilon_o$ is the electrical permittivity of free space and d is the separation distance between the plate electrodes of the mic.

As is known, charge across a capacitor may be represented $$Q = C \cdot V \quad \text{(Eqn. 2)}$$

In a piezoelectric mic, capacitance is substantially fixed, and the voltage varies, thereby resulting in a change in charge according to the relation:

$$\Delta Q = C \Delta V \quad \text{(Eqn. 3)}$$

As is known, there is a need to provide suitable sensitivity with the mic. This proves an ever-increasing challenge with smaller mics. From Eqn. 1, it can be appreciated that by reducing the distance (d) and increasing the dielectric constant ($\kappa$) of the piezoelectric material the capacitance of a piezoelectric mic can be comparatively large. The higher level of capacitance of a piezoelectric mic may simplify sensor signal processing circuit design.

While piezoelectric mics are useful in certain applications, there are drawbacks to known piezoelectric mics. For example, assuming that the c-axis of the piezoelectric material does not significantly change across the membrane of the mic, the voltage sensitivity (V/q) couples through the lateral stress, $\sigma_y$, and is ideally proportional thereto. Moreover, in an ideal clamped, thin plate piezoelectric mic under uniform load, there are at least two regions of differing curvature.

In a first region, the top of the piezoelectric layer may be in compressive stress (negative lateral stress), and the bottom of the piezoelectric layer may be in tensile stress (positive lateral stress). Consequently, this first region has a first voltage polarity. In a second region, the top of the piezoelectric layer may be in tensile stress, and the bottom of the piezoelectric layer may be in compressive stress. Consequently, this second region has a second voltage polarity that is opposite the polarity of the first region. If the mic has an upper electrode continuous across both the first and second regions and a lower electrode continuous across the first and second regions, then the opposite polarities of the first and second region may result in a normalization of charge (and hence electrical potential difference) across the first and second regions. This charge normalization can result in a lower sensitivity. As will be appreciated, this reduction in sensitivity is undesirable, especially in comparatively small-dimension mics.

There is a need, therefore, for a transducer structure and an electronic device that address at least the shortcomings described above.

SUMMARY

In accordance with an illustrative embodiment, a transducer structure includes a first transducer, which comprises: a first inner electrode; a first outer electrode; a lower inner electrode; a lower outer electrode; a first piezoelectric element disposed between the first electrodes and the lower electrodes; a first gap between the first inner electrode and the first outer electrode; and a lower gap between the lower inner electrode and the lower outer electrode. The transducer structure also includes a second transducer, which comprises: a second inner electrode; a second outer electrode; the lower inner electrode; the lower outer electrode; a second piezoelectric element disposed between the second electrodes and the lower electrodes; and a second gap between the second inner electrode and the second outer electrode.

In accordance with an illustrative embodiment, a transducer structure, includes a first transducer, which comprises: a first upper inner electrode; a first upper outer electrode; a first lower inner electrode; a first lower outer electrode; a first upper gap between the first upper inner electrode and the first upper outer electrode; a first lower gap between the first lower inner electrode and the first lower outer electrode; and a first piezoelectric element disposed between the first upper electrodes and the first lower electrodes. The transducer structure also includes a second transducer structure, which comprises: a second upper inner electrode; a second upper outer electrode; a second lower inner electrode; a second lower outer electrode; a second upper gap between the second upper inner electrode and the second upper outer electrode; a second lower gap between the second lower inner electrode and the second lower outer electrode; and a second piezoelectric element disposed between the second upper electrodes and the second lower electrodes; and a barrier disposed between the first and second transducers.

In accordance with another representative embodiment, a microphone includes a first transducer, which comprises: a first inner electrode; a first outer electrode; a lower inner electrode; a lower outer electrode; a first piezoelectric element disposed between the first electrodes and the lower electrodes; a first gap between the first inner electrode and the first outer electrode; and a lower gap between the lower inner electrode and the lower outer electrode. The microphone also includes and a second transducer, which comprises: a second inner electrode; a second outer electrode; the lower inner electrode; the lower outer electrode; a second piezoelectric element disposed between the second electrodes and the lower electrodes; and a second gap between the second inner electrode and the second outer electrode.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

The terms 'a' or 'an', as used herein are defined as one or more than one.

The term 'plurality' as used herein is defined as two or more than two.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of materials and methods may be omitted so as to avoid obscuring the description of the illustrative embodiments. Nonetheless, such materials and methods that are within the purview of one of ordinary skill in the art may be used in accordance with the illustrative embodiments. Such materials and methods are clearly within the scope of the present teachings.

The piezoelectric mics of the representative embodiments are contemplated for use in a variety of electronic devices. A representative electronic device may be a portable device such as a mobile phone, a camera, a video camera, a personal digital assistant (PDA), a sound recording device, a laptop computer, a tablet computer, a handheld computer, a handheld remote, or an electronic device that comprises the functionality of one or more of these devices. It is emphasized that the noted devices are merely illustrative and that other devices are contemplated. In some representative embodiments, the electronic device is a device that benefits from a microphone structure having a plurality of microphones, with at least one microphone optionally being adapted to function in more than one mode.

In many representative embodiments, the electronic devices are portable. However, this is not essential. In particular, the microphone structures of the present teachings are also contemplated for use in devices/apparatuses that are substantially stationary; and in devices/apparatuses that are mobile, but in which the microphone structures remain substantially stationary. For example, the microphone structures of representative embodiments may be used in industrial machinery applications, motor vehicle applications, aircraft applications, and watercraft applications, to name only a few.

Additionally, while the present description is drawn primarily to microphones, the present teachings contemplate applications to transducers in general. For example, as one of ordinary skill in the art will readily appreciate, the present teachings may be applied to piezoelectric speakers.

Figure 1A:
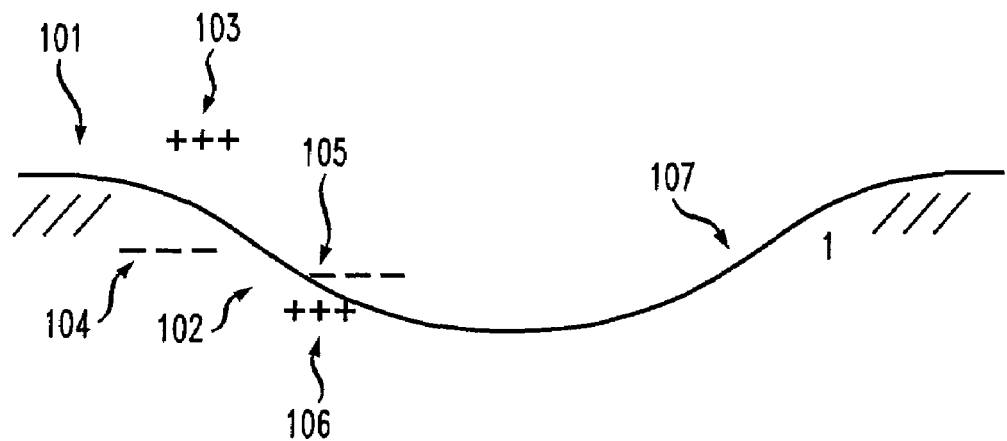
FIG. 1A is a conceptual view of a portion of a piezoelectric mic in accordance with a representative embodiment.

FIG. 1A is a conceptual view of a portion of a piezoelectric mic in an essentially ideal thin-plate representation in cross-section in accordance with a representative embodiment. The mic comprises a piezoelectric layer 101, which may be clamped. Electrodes are disposed over the piezoelectric layer 101, but are not shown to more clearly convey certain aspects of the present teachings.

As the piezoelectric layer 101 oscillates in response to a mechanical perturbation (e.g., a sound wave), the forces generated by the perturbation induce stresses in the piezoelectric layer resulting in generation of a voltage difference across the electrodes. Assuming the layer 101 of piezoelectric material (e.g., AlN, ZnO or lead zirconium titanate (PZT)) has a c-axis substantially orthogonal to the membrane surface, the voltage sensitivity is proportional to the lateral stress, $\sigma_y$, and the ratio of the piezoelectric strain matrix coefficient ($d_{31}$) and the electric permittivity coefficient ($\epsilon_{33}$).

In the present example, the layer 101 has inflection points 102, 107. In regions away from the inflection points 102, 107, the lateral stress can be a positive lateral stress (tensile stress) or a negative lateral stress (compressive stress). For instance, in region 103, the upper surface of layer 101 is subject to a tensile stress and in region 104, the lower surface of layer 101 is subject to a compressive stress. Similarly, in region 106 the lower surface of layer 101 is subject to a tensile stress, and in region 105 the upper surface of layer 101 is subject to a compressive stress. As such, in the present example, region 103 has a net charge due to the piezoelectric effect, and region 104 has a net opposite charge; region 105 has a net charge and region 106 has a net opposite charge. If the upper and lower electrodes were continuous over the upper and lower surfaces of layer 101, respectively, then, as noted previously, charge normalization may occur between regions 103, 105 and regions 104, 106, which in-turn may limit the voltage sensitivity in known mics.

According to representative embodiments, selective connections to the regions 103-106 are made to provide capacitors in parallel, or capacitors in series, or both. As will be described more fully, this selective connection results in improved voltage sensitivity or charge sensitivity, or both.

Figure 1B:
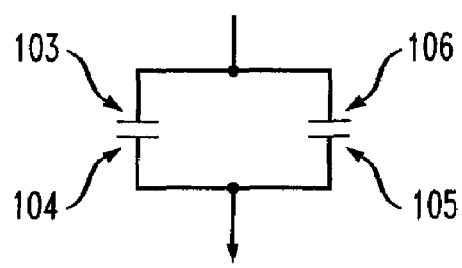
FIG. 1B is an equivalent circuit diagram in accordance with a representative embodiment.

In representative embodiments described herein, gaps are provided between the electrodes located in regions of inflection points. These gaps allow for the selective connection of electrodes to realize capacitors in parallel or in series. For example, with electrodes disposed over both sides of the piezoelectric layer 101 and having gaps in regions of the inflection points 102, 107, connections can be made between electrodes disposed over regions 103 and 106, and between electrodes disposed over regions 104 and 105. In this arrangement, the capacitances are connected in parallel in an equivalent circuit as shown in FIG. 1B. As such, the capacitances add, providing an increased charge, and thus improved charge sensitivity of the mic.

Alternatively, the selective connection can be made to provide capacitors in series. As will be appreciated, two capacitors ($C_1$, $C_2$) connected in series have a total capacitance ($C_T$) given by:

$$C_T = \frac{C_1 * C_2}{C_1 + C_2} \quad \text{(Eqn. 4)}$$

Figure 1C:
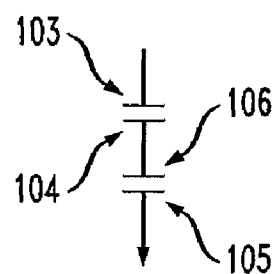
FIG. 1C is an equivalent circuit diagram in accordance with a representative embodiment.

In a series combination, connections may be made between electrodes disposed over regions 104 and 106. FIG. 1C shows a series connection of an equivalent circuit according to this arrangement. As will be appreciated, because the voltages across the capacitors add in a series combination, the voltage sensitivity of the mic is improved.

The selection of parallel or series capacitor combinations is driven by a number of considerations. For example, the sensor circuit (not show) used to convert the electrical signal from the mic to an audio signal is often an important consideration in the selection of connections between the electrodes. Illustratively, some sensor circuits comprise complementary metal oxide semiconductor (CMOS) sensor circuits, which may exhibit noise, such as well-known 1/f (also commonly referred to as flicker noise) or thermal noise (also commonly referred to as Johnson noise). In some embodiments, improving the voltage sensitivity of the mic(s) may be desired to improve the signal to noise ratio (SNR). In this example, the electrodes are connected to provide capacitors in series. Alternatively, in other embodiments, it may be more desirable to sense the charge extracted from the mic. In these embodiments, the electrodes may be connected to provide capacitors in parallel.

Furthermore, the crystallographic axis (c-axis) of the piezoelectric material impacts the direction of the displacement vector in the material and thus the voltage polarity depending on whether the force on the material is tensile or compressive. In representative embodiments described herein, the c-axes of stacked piezoelectric layers of transducer structures are selected to provide signals of the same polarity or signals of opposite polarity.

Figure 2A:
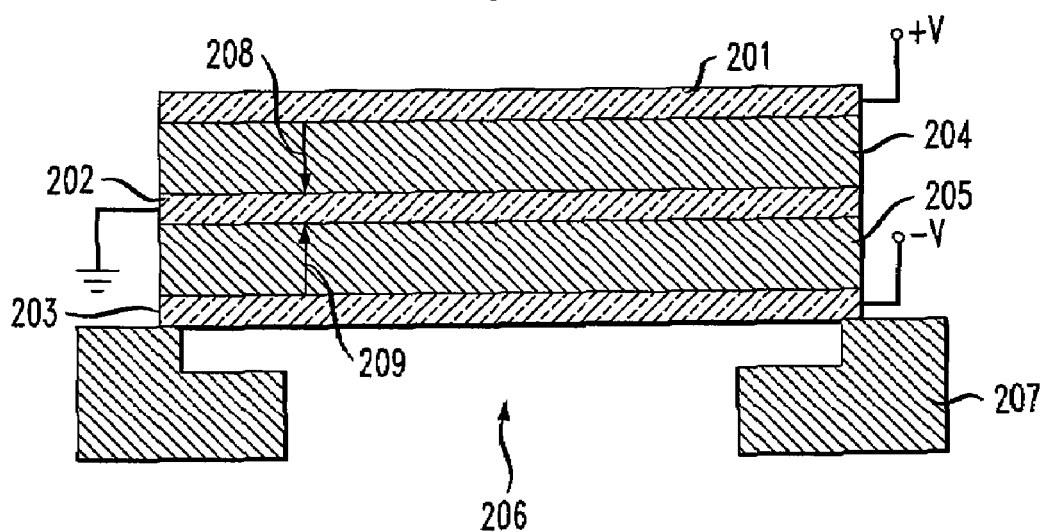
FIG. 2A is a cross-sectional of a transducer structure in accordance with a representative embodiment.
Figure 2B:
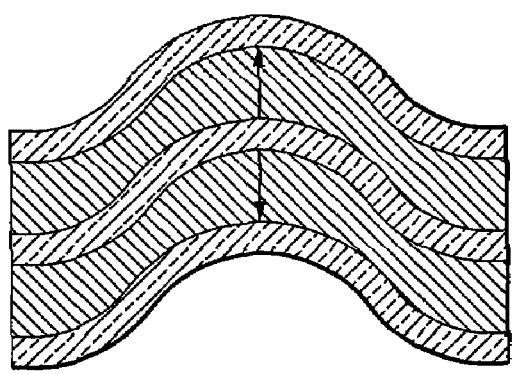
FIG. 2B is a cross-sectional view of a transducer structure subject to an external force in accordance with a representative embodiment.
Figure 2C:
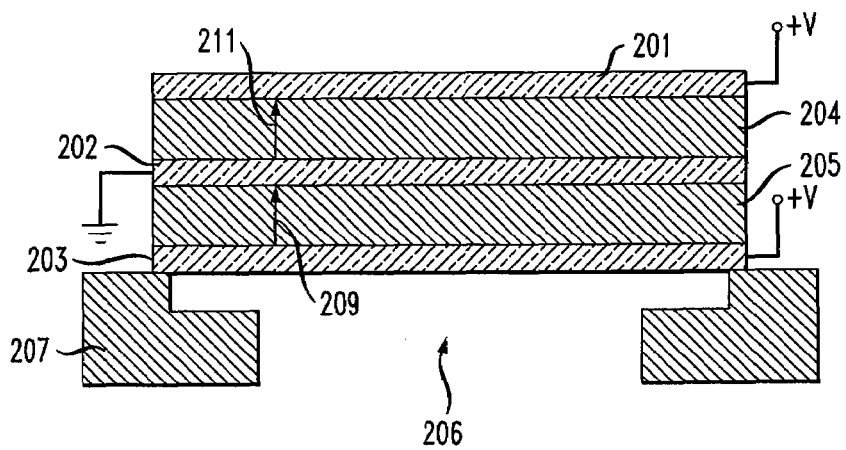
FIG. 2C is a cross-sectional view of a transducer structure in accordance with a representative embodiment.

FIGS. 2A-2C are cross-sectional views of multi-layer transducer structures in accordance with representative embodiments. As noted previously, representative embodiments include annular contacts having gaps disposed at inflection points. These gaps are not shown or described in connection with FIGS. 2A-2C. Rather, a description of the function of transducer structures having different c-axis orientations are described. The use and function of the gaps in multi-layer transducers are described in connection with embodiments of FIGS. 3A-4.

FIG. 2A is a cross-sectional view of a multi-layer transducer structure 200 in accordance with a representative embodiment. The transducer structure 200 includes a first electrode 201, a lower electrode 202 and a second electrode 203. A first piezoelectric element 204 is disposed between the first electrode 201 and the lower electrode 202; and a second piezoelectric element 205 is disposed between the second electrode 203 and the lower electrode 202. The transducer structure 200 thus includes two piezoelectric layers and may thus be regarded as a bimorph structure. Illustratively, both piezoelectric elements 204, 205 may comprise the same piezoelectric material, for example, AlN, ZnO, or PZT. However, in the presently described and other representative embodiments described herein, the piezoelectric elements may comprise different piezoelectric materials.

The structure 200 also includes a substrate 207 having a cavity 206 therethrough. The function of the cavity 206 is described in detail in the parent application, and as described in commonly owned U.S. patent application Ser. No. 11/588,752 entitled "Piezoelectric Microphones," to R. Shane Fazzio, et al. The disclosure of this application is specifically incorporated herein by reference.

The first piezoelectric element 204 has a c-axis 208 oriented as shown; the second piezoelectric element 205 has a c-axis 209, which is antiparallel to the c-axis 208; and the neutral axis (not shown) is through the lower electrode 202. As will be readily appreciated by one of ordinary skill in the art, application of a force (e.g., pressure from a sound wave) will result in flexure of the transducer structure, for example as shown in FIG. 2B.

At the clamped ends of the transducer structure 200 (e.g., at the points of attachment to the substrate 207) the curvature will result in a compressive force in one piezoelectric element and a tensile force in the other piezoelectric element. Because the c-axes of the piezoelectric elements are anti-parallel, this results in a (relative) positive polarity across one piezoelectric layer in relation to the common electrode and a (relative) negative polarity across the other piezoelectric layer in relation to the common electrode, at least up to an inflection point in the curvature of the deflection. Moreover, at the center, a similar affect occurs. As will be appreciated the induced forces and thus voltages at the center will differ as described in connection with FIG. 1A.

With the lower electrode 202 at a reference potential (arbitrarily indicated as ground), the induced potentials of the first and second electrodes are opposite. Illustratively, the first electrode 201 is at a positive potential and the second electrode 203 is at a negative potential with respect to the reference potential. As will be appreciated, the sign of the voltage depends on the piezoelectric material; thus the noted signs of the voltages are arbitrary and illustrative.

In the present embodiment, the plate capacitances formed by the respective piezoelectric elements and electrodes are connected in series. Accordingly, the transducer structure 200 is useful to increase the voltage output compared to single transducer devices. As described in the parent application, this may useful in improving voltage sensitivity and the signal to noise ratio (SNR) in various applications, such as microphones. Moreover, the signals may be combined differentially to effect noise cancellation due to, for example, electromagnetic interference.

FIG. 2C is a cross-sectional view of a transducer structure 210 in accordance with another representative embodiment. The structure 210 is substantially identical in component and function as the structure 200, excepting in the orientation of the c-axes of the piezoelectric elements. In particular, the c-axis 209 of second piezoelectric element 205 is parallel to a c-axis 211 of the first piezoelectric element 204. Again, application of a force will result in flexure as shown in FIG. 2B. At the clamped ends of the transducer structure 210, the curvature will result in a compressive force in one piezoelectric element and a tensile force in the other piezoelectric element. Because the c-axes of the piezoelectric elements are parallel, this results in the same voltage polarity at the ends the piezoelectric elements 204,205. Again, at the center, a similar affect occurs; however, the induced forces and thus voltages at the center will differ as described in connection with FIG. 1A.

With the lower electrode 202 at a reference potential (arbitrarily selected as ground), the induced potentials of the first and second electrodes are the same.

Illustratively, the electrodes 201, 203 are at a positive potential. Again, the sign of the voltage depends on the piezoelectric material; thus the noted signs of the voltage are arbitrary and illustrative. As will be appreciated, in the present embodiment, the plate capacitances formed by the respective piezoelectric elements and electrodes are connected in parallel. As a result, the capacitances add and the overall charge output is increased compared to single transducer devices.

Figure 3A:
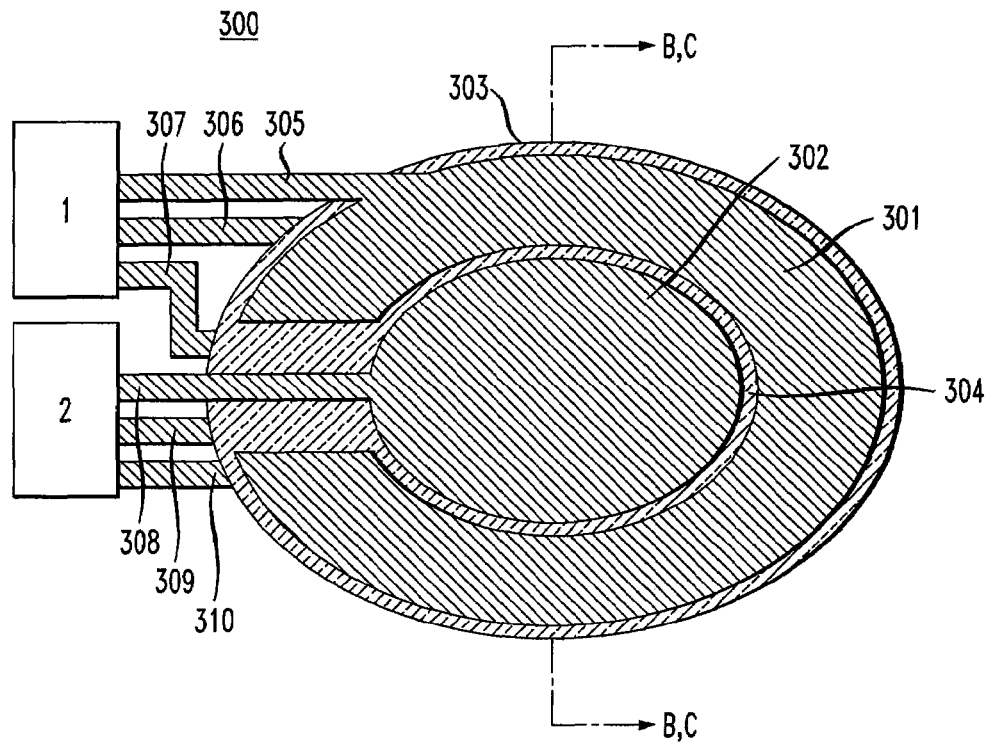
FIG. 3A is a top view of a transducer structure in accordance with a representative embodiment.
Figure 4:
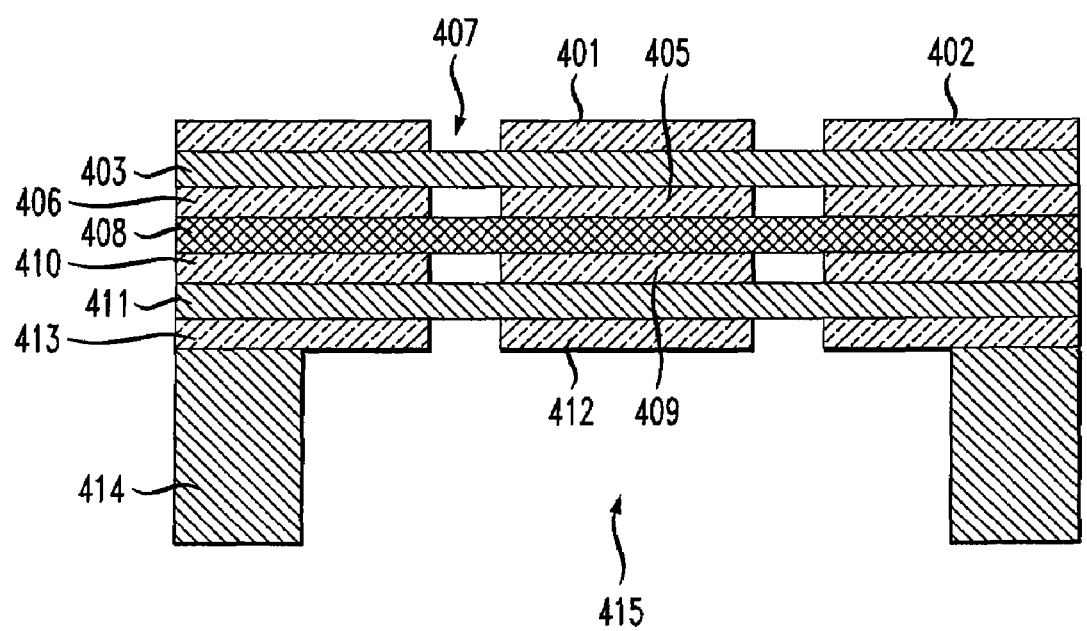
FIG. 4 is a cross-sectional view of a transducer structure in accordance with a representative embodiment

FIG. 3A is a top view of a transducer structure 300 in accordance with a representative embodiment. The transducer structure 300 includes a first outer electrode 301 and a first inner electrode 302 disposed over a first piezoelectric element 303. A gap 304 is provided between the first inner electrode 302 and the first outer electrode 301. Beneficially, the gap 304 is provided in a region of an inflection point of the transducer 300 as described in detail in the parent application and above. Moreover, as described in the parent application variations in the location and width of the gap 304 relative to the other gaps are contemplated.

As noted previously, the gap 304 is provided in a region of an inflection point. As will be appreciated by one of ordinary skill in the art, the inflection points of a clamped oscillating membrane, such as a mic structure are dependent upon a number of factors including, but not limited to: the shape of the structure; the materials selected for the structure; the thickness of the materials of the structure; the boundary conditions of the structure; and the applied stress. Illustratively, the inflection points can be determined from finite element simulations to determine bending characteristics over different loading conditions. Notably, these simulations provide the behavior of composite structures with selected boundary conditions (e.g., clamps) and loading conditions (e.g., mass-loading layers and pressures).

Representative embodiments include electrodes (and thus mics) having a substantially circular shape, with the inner and outer electrodes being in a concentric relationship. It is emphasized that other annular structures are contemplated. For example, the inner electrode 302 may be square or rectangular in shape, with outer electrode 301 concentric therewith. Alternatively, the electrodes 301,302 may be elliptical in shape and disposed in a concentric arrangement. Still concentric inner and outer electrodes of other shapes are contemplated. For example, the electrodes may be apodized.

Connections 305,306,307 are made to the first outer electrode 301, second outer electrode (not shown in FIG. 3A) and lower inner electrode (not shown in FIG. 3A), respectively. Similarly, connections 308,309,310 are made to the first inner electrode 302, second inner electrode (not shown in FIG. 3A) and lower outer electrode (not shown in FIG. 3A), respectively.

The connections 305-310 are made to contact pads 1,2 as shown. The signals from the contact pads may then be provided to signal processing circuitry (not shown) to effect a desired result. It is emphasized that the connections to the pads as shown are merely illustrative. As will be appreciated by one skilled in the art, the connections of the various electrodes may be tailored to provide series capacitance, or parallel capacitance, or both, in order to achieve a desired result with the device or system that includes the transducer structure 300.

Furthermore, the electrodes 301,302 are also merely illustrative of one arrangement and structure thereof. In particular, section gaps and connections between the sections of the electrodes, which are described in the parent application, may be provided in transducer structure 300. Furthermore, in certain embodiments, the inner electrodes may be foregone; and the transducer structure comprises outer annular electrodes, selectively connected to provide series capacitance, or parallel capacitance, or both, in order to achieve a desired result.

Figure 3B:
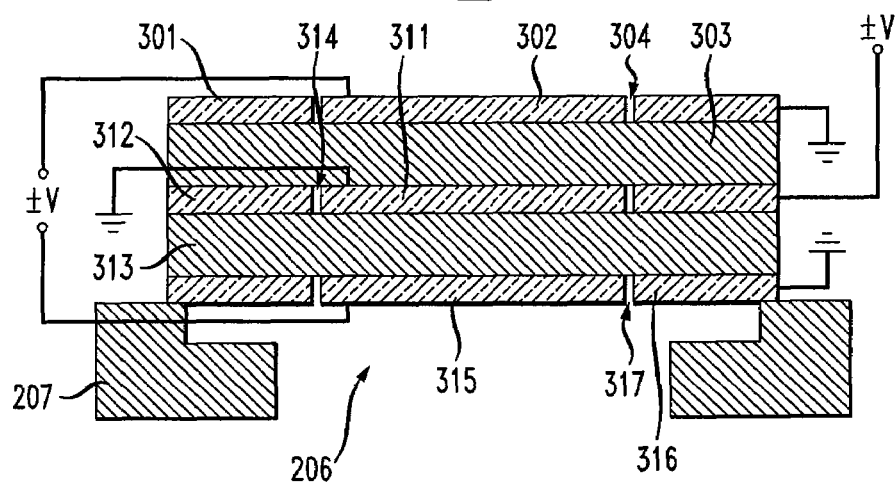
FIG. 3B is a cross-sectional view of a transducer structure of the structure of FIG. 3A taken along the line B,C.

FIG. 3B is a cross-sectional view of the transducer structure 300 taken along the line B,C. FIG. 3B illustrates a lower inner electrode 311 and a lower outer electrode 312 disposed over a second piezoelectric element 313 and separated by a gap 314. A second inner electrode 315 and a second outer electrode 316 are disposed beneath the second piezoelectric element 313 and separated by a gap 317. As described in the parent application, the gaps 304, 314 and 317 are located in regions of inflection points of the substrate. The gaps 304, 314, 317 may be aligned or not aligned relative to one another, and may be of differing width; also as described in the parent application.

As described previously, the structure 300 is disposed over substrate 207, which has cavity 206. This arrangement is useful in many applications, such as microphone applications. Notably, in certain applications, the cavity 206 need not extend through the substrate. Rather, a recess or cavity (often informally referred to as a swimming pool) in the substrate suffices for the membrane structure of the transducer.

As described in connection with FIGS. 2A and 2B, the relative orientation of the c-axes of the piezoelectric elements 303,313 dictates the relative polarity of the voltages induced in the piezoelectric elements 303,313. For example, in representative embodiments the c-axes of the elements 303,313 are in the plane of FIG. 3B and are orthogonal to the electrodes. In one embodiment, the c-axes are parallel or aligned relative to one another. With the lower inner electrode 311 and first and second outer electrodes 301,316, respectively, at a reference voltage (again, arbitrarily, but not necessarily, at ground potential), various voltages are realized at other electrodes. For example, in one embodiment, the voltage polarities across the lower outer electrode 312 and first outer electrode 301; and across the lower outer electrode 312 and the second lower electrode 316 are the same (e.g., positive). The plate capacitances thus add and the charge output is increased compared to a single transducer. Similarly, the voltage polarities across the first and second inner electrodes 302,315 are the same (negative, following the example). Plate capacitances again add and the charge output is increased compared to a single transducer. By similar analysis to that described above and in the parent application, the selective connection of electrodes usefully provides plate capacitances in parallel and improved charge sensitivity.

Alternatively, in representative embodiments the c-axes are anti-parallel or oppositely aligned relative to one another. Again, the lower inner electrode 311 and first and second outer electrodes 301,316, respectively, are at a reference voltage (again, arbitrarily, but not necessarily, at ground potential). For example, in one embodiment, the voltage polarities across lower outer electrode 312 and first outer electrode 301; and across the lower outer electrode 312 and the second lower electrode 316 are opposite to one another, each with respect to the reference voltage. Similarly, the voltage polarities at the across the inner electrodes 302,315 are the opposite of one another, again with respect to the reference voltage. As described previously, selective connection of the electrodes may be effected to exact differential signals, or to increase the voltage output compared to a single transducer. By similar analysis to that described above and in the parent application, the selective connection of electrodes usefully provides capacitance in parallel and improved voltage sensitivity.

Figure 3C:
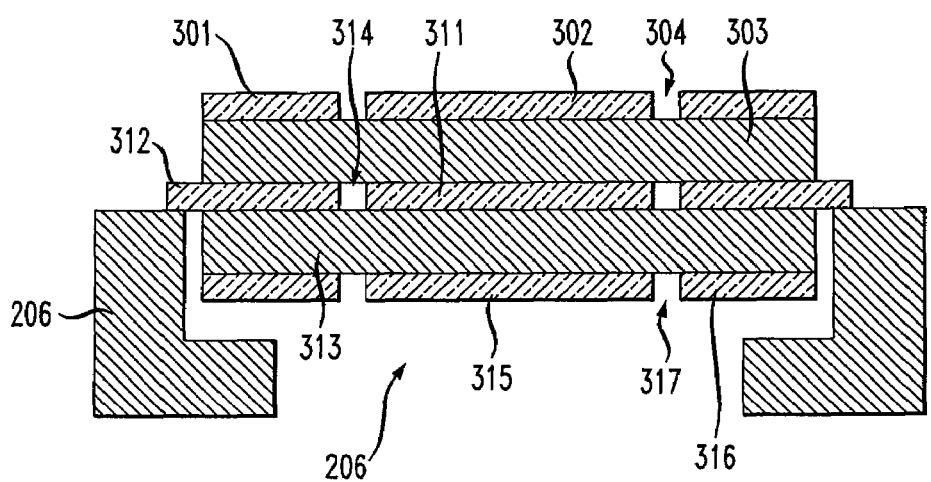
FIG. 3C is a cross-sectional view of a transducer structure in accordance with a representative embodiment

FIG. 3C is a cross-sectional view of a transducer structure 318 taken along the line B,C in FIG. 3A and in accordance with another representative embodiment. The structure 318 is substantially the same as structure 300 described in conjunction with FIGS. 3A and 3B. However, in the present embodiment, the lower outer electrode 312 extends over the substrate 207 and provides the support for the structure 318. The functionality and connections are substantially identical to that described in connection with the representative embodiments of FIG. 3B. Moreover, the membrane structure may be attached to the substrate 207 by other known methods and materials; for example, attachment using one of the other layers of the transducer structure 318 or with two or more of the layers of the structure 318, are also contemplated.

The embodiments described to this point include two transducers, which share common lower inner and outer electrodes. However, other embodiments are contemplated. A transducer structure 400 according to one such embodiment is illustrated in cross-section in FIG. 4. Notably, the transducer structure 400 shares many features with those described in connection with embodiments of FIGS. 1A-3C. Such common features are generally not repeated in order to avoid obscuring the description of the present embodiment.

The transducer structure 400 comprises a first transducer having a first upper inner electrode 401 and a first upper outer electrode 402 disposed over a first piezoelectric element 403. The first transducer also includes a first lower inner electrode 405 and a first lower outer electrode 406 disposed beneath the element 403 and over a barrier 408.

A second transducer is disposed over a substrate 414 having a cavity 415. The second transducer includes a second upper inner electrode 409 and a second upper outer electrode 410 disposed over a second piezoelectric element 411. The second transducer further includes a second lower inner electrode 412 and a second lower outer electrode 413 disposed beneath the second piezoelectric element 411. Moreover, gaps 407 are provided between the inner and outer electrodes of the first and second transducers as shown. In other representative embodiments, only an outer electrode may be provided. In yet other representative embodiments, only an inner electrode may be provided.

In representative embodiments, the barrier 408 provides isolation between the first and second transducers allowing the transducers to function substantially independently. Illustratively, the barrier 408 may be one or more layers of silicon low-k dielectric (SILK) or other suitable material(s). Moreover, the barrier 408 may be as described in commonly assigned U.S. Pat. No. 6,946,928 to Larson III, et al. The disclosures of these patents and publications are specifically incorporated herein by reference.

In accordance with a representative embodiment, signals from each transducer may be obtained and processed independently; or may be combined in order to optimize the joint behavior of the first and second transducers. For example, the first and second transducers may be selectively connected in a series or parallel fashion. Furthermore, electrode regions on each transducer may be selectively connected in a series or parallel fashion. Similar to the structure shown in FIG. 3C, the barrier layer 408 may be used as a physical support for the membrane, providing attachment to the underlying substrate. In some embodiments, at least one or a plurality of layers may provide attachment to the underlying substrate.

As described previously, the c-axes of the elements 403, 411 may be aligned parallel or anti-parallel to exact different voltage outputs in different applications. The connections to the electrodes may be selectively effected to provide series or parallel plate capacitances, or both. Illustratively, the c-axes 403,411 may be anti-parallel and the electrodes connected to effect common mode rejection.

In the representative embodiments described herein, voltage sensitivity and charge sensitivity of piezoelectric mics are improved compared to known structures by reducing charge-normalization found in single electrode structures. As will be appreciated by one of ordinary skill in the art, many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A transducer structure, comprising:
   a first transducer, which comprises:
   a first inner electrode;
   a first outer electrode, which is substantially concentric with the first inner electrode;
   a lower inner electrode;
   a lower outer electrode, which is substantially concentric with the lower inner electrode;
   a first piezoelectric element disposed between the first electrodes and the lower electrodes;
   a first gap between the first inner electrode and the first outer electrode; and a lower gap between the lower inner electrode and the lower outer electrode; and
   a second transducer disposed over the first transducer, the second transducer comprising:
   a second inner electrode;
   a second outer electrode, which is substantially concentric with the second inner electrode;
   the lower inner electrode;
   the lower outer electrode;
   a second piezoelectric element disposed between the second electrodes and the lower electrodes; and a second gap between the second inner electrode and the second outer electrode.

2. A transducer structure as claimed in claim 1, wherein the first piezoelectric element has a first c-axis and the second piezoelectric element has a second c-axis.

3. A transducer structure as claimed in claim 2, wherein the first c-axis and the second c-axis are substantially parallel.

4. A transducer structure as claimed in claim 2, wherein the first c-axis and the second c-axis are substantially anti-parallel.

5. A transducer structure as claimed in claim 1, wherein the inner and outer electrodes of the first and second transducers are selectively connected to provide a differential voltage output.

6. A transducer structure as claimed in claim 1, wherein the inner and outer electrodes of the first and second transducers are selectively connected to provide at least one of substantially the same voltage output, an additive charge output, or a combination of the output voltage and the additive charge output.

7. A transducer structure as claimed in claim 1, wherein the first, second and lower inner and outer electrodes are substantially circular.

8. A transducer structure as claimed in claim 1, further comprising:
a substrate having a first side and a second side;
a cavity in the substrate from the first side substantially to the second side.

9. A transducer structure as claimed in claim 1, wherein the first, second and lower electrodes each comprise a plurality of sections, which are separated by section gaps.

10. A transducer structure as claimed in claim 1, wherein the first gap, the second gap and the lower gap are located to substantially coincide with respective inflection points of the transducer structure during bending.

11. A transducer structure, comprising:
a first transducer, which comprises:
a first upper inner electrode;
a first upper outer electrode;
a first lower inner electrode;
a first lower outer electrode;
a first upper gap between the first upper inner electrode and the first upper outer electrode;
a first lower gap between the first lower inner electrode and the first lower outer electrode; and a first piezoelectric element disposed between the first upper electrodes and the first lower electrodes;
a second transducer structure disposed over the first transducer, the second transducer comprising:
a second upper inner electrode;
a second upper outer electrode;
a second lower inner electrode;
a second lower outer electrode;
a second upper gap between the second upper inner electrode and the second upper outer electrode;
a second lower gap between the second lower inner electrode and the second lower outer electrode; and a second piezoelectric element disposed between the second upper electrodes and the second lower electrodes; and
a barrier disposed between the first and second transducers.

12. A transducer structure as claimed in claim 11, wherein the first piezoelectric element has a first c-axis and the second piezoelectric element has a second c-axis.

13. A transducer structure as claimed in claim 12, wherein the first c-axis and the second c-axis are substantially parallel.

14. A transducer structure as claimed in claim 12, wherein the first c-axis and the second c-axis are substantially anti-parallel.

15. A transducer structure as claimed in claim 11, further comprising:
a substrate having a first side and a second side; and
a cavity in the substrate from the first side substantially to the second side.

16. A transducer structure as claimed in claim 15, wherein the barrier spans the cavity and the second transducer is disposed substantially in the cavity.

17. A transducer structure as claimed in claim 11, wherein the inner and outer electrodes of the first and second transducers are selectively connected to provide a differential voltage output.

18. A transducer structure as claimed in claim 11, wherein the inner and outer electrodes of the first and second transducers are selectively connected to provide at least one of substantially the same voltage output, an additive charge output, or a combination of the output voltage and the additive charge output.

19. A transducer structure as claimed in claim 11, wherein the first and second upper gaps, and the first and second lower gaps are located to substantially coincide with respective inflection points of the transducer structure during bending.

20. A transducer structure as claimed in claim 11, wherein the first and second transducers are substantially acoustically isolated by the barrier.

21. A transducer structure as claimed in claim 11, wherein the transducer structure is a microphone.

22. A microphone, comprising:
a first transducer, which comprises:
a first inner electrode;
a first outer electrode;
a lower inner electrode;
a lower outer electrode;
a first piezoelectric element disposed between the first electrodes and the lower electrodes;
a first gap between the first inner electrode and the first outer electrode; and a lower gap between the lower inner electrode and the lower outer electrode; and
a second transducer disposed over the first transducer, the second transducer comprising:
a second inner electrode;
a second outer electrode;
the lower inner electrode;
the lower outer electrode;
a second piezoelectric element disposed between the second electrodes and the lower electrodes; and a second gap between the second inner electrode and the second outer electrode.

* * * * *